(12) United States Patent
Takamiya et al.

(10) Patent No.: US 9,899,971 B1
(45) Date of Patent: Feb. 20, 2018

(54) OFFSET DETECTION CIRCUIT

(71) Applicant: KABUSHIKI KAISHA TOSHIBA, Tokyo (JP)

(72) Inventors: Shimon Takamiya, Yokohama Kanagawa (JP); Kouichi Yamashita, Ota Tokyo (JP); Toshiyuki Morishige, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/438,467

(22) Filed: Feb. 21, 2017

(30) Foreign Application Priority Data

Sep. 21, 2016 (JP) ................................ 2016-184339

(51) Int. Cl.
*H03F 3/21* (2006.01)
*H03F 3/183* (2006.01)
*H04R 3/00* (2006.01)

(52) U.S. Cl.
CPC ............. *H03F 3/21* (2013.01); *H03F 3/183* (2013.01); *H04R 3/007* (2013.01); *H03F 2200/03* (2013.01); *H03F 2200/171* (2013.01); *H03F 2200/375* (2013.01)

(58) Field of Classification Search
CPC ..................... H03F 3/45892; H03F 2200/375
USPC .................................................. 330/2, 9
See application file for complete search history.

(56) References Cited

U.S. PATENT DOCUMENTS

| 3,581,198 | A | * | 5/1971 | Shoemaker | ............ | G01R 27/28 |
| | | | | | | 324/73.1 |
| 6,339,567 | B1 | * | 1/2002 | Shimamoto | ............ | G11B 7/094 |
| | | | | | | 369/44.29 |
| 2012/0274381 | A1 | * | 11/2012 | Pyo | ................... | G01R 33/0029 |
| | | | | | | 327/307 |
| 2013/0049855 | A1 | * | 2/2013 | Berkhout | ............. | H03F 3/2173 |
| | | | | | | 330/2 |

FOREIGN PATENT DOCUMENTS

| JP | 2004320273 A | 11/2004 |
| JP | 2009071743 A | 4/2009 |
| JP | 2012085040 A | 4/2012 |

* cited by examiner

*Primary Examiner* — Henry Choe
(74) *Attorney, Agent, or Firm* — Patterson & Sheridan, LLP (57) ABSTRACT

An offset detection circuit includes: a comparison unit that generates a first comparison result between an amplifier output and a positive detection threshold value, and a second comparison result between the amplifier output and a negative detection threshold value; a first determination unit that generates a first offset determination result of two values indicating presence or absence of an offset according to a period during which the amplifier output exceeds the positive detection threshold value, based on the first comparison result; a second determination unit that generates a second offset determination result of two values indicating the presence or absence of an offset according to a period during which the amplifier output exceeds the negative detection threshold value, based on the second comparison result; and an output unit that generates a determination output of the offset based on the first and second offset determination results.

20 Claims, 9 Drawing Sheets

OFFSET DETECTION CIRCUIT

CROSS-REFERENCE TO RELATED APPLICATION

This application is based upon and claims the benefit of priority from Japanese Patent Application No. 2016-184339, filed Sep. 21, 2016, the entire contents of which are incorporated herein by reference.

FIELD

Embodiments described herein relate generally to an offset detection circuit.

BACKGROUND

Generally, when output of a power amplifier circuit (power amplifier) that amplifies an audio signal is supplied to a speaker, an offset detection circuit may be adopted for removing a DC offset in the output of an amplifier in order to prevent damage to the speaker.

However, the offset detection circuit in the related art cannot detect the DC offset at the time of audio reproduction (at the time of presence of signal), but can detect the DC offset only when there is no signal such as when an audio set is activated, and thus the damage of the speaker may not be reliably prevented.

Even in the related art, an offset detection circuit can detect the offset at the time of the presence of the signal. However, there is a problem that a low pass filter having a large time constant or a DC shift circuit is required.

DETAILED DESCRIPTION

Embodiments provide an offset detection circuit capable of reliably detecting an offset even when an AC signal is input to an amplifier.

In general, according to one embodiment, an offset detection circuit includes: a comparison unit connected to an output of an amplifier that amplifies an input signal and configured to generate a first comparison result between the output of the amplifier and a positive detection threshold value, and a second comparison result between the output of the amplifier and a negative detection threshold value; a first determination unit configured to generate a first offset determination result of two values indicating presence or absence of an offset according to a period during which the output of the amplifier exceeds the positive detection threshold value, based on the first comparison result; a second determination unit configured to generate a second offset determination result of two values indicating the presence or absence of an offset according to a period during which the output of the amplifier exceeds the negative detection threshold value, based on the second comparison result; and an output unit configured to generate a determination output of the offset based on the first and second offset determination results.

Hereinafter, exemplary embodiments will be described in detail with reference to the drawings.

First Embodiment

Figure 1:
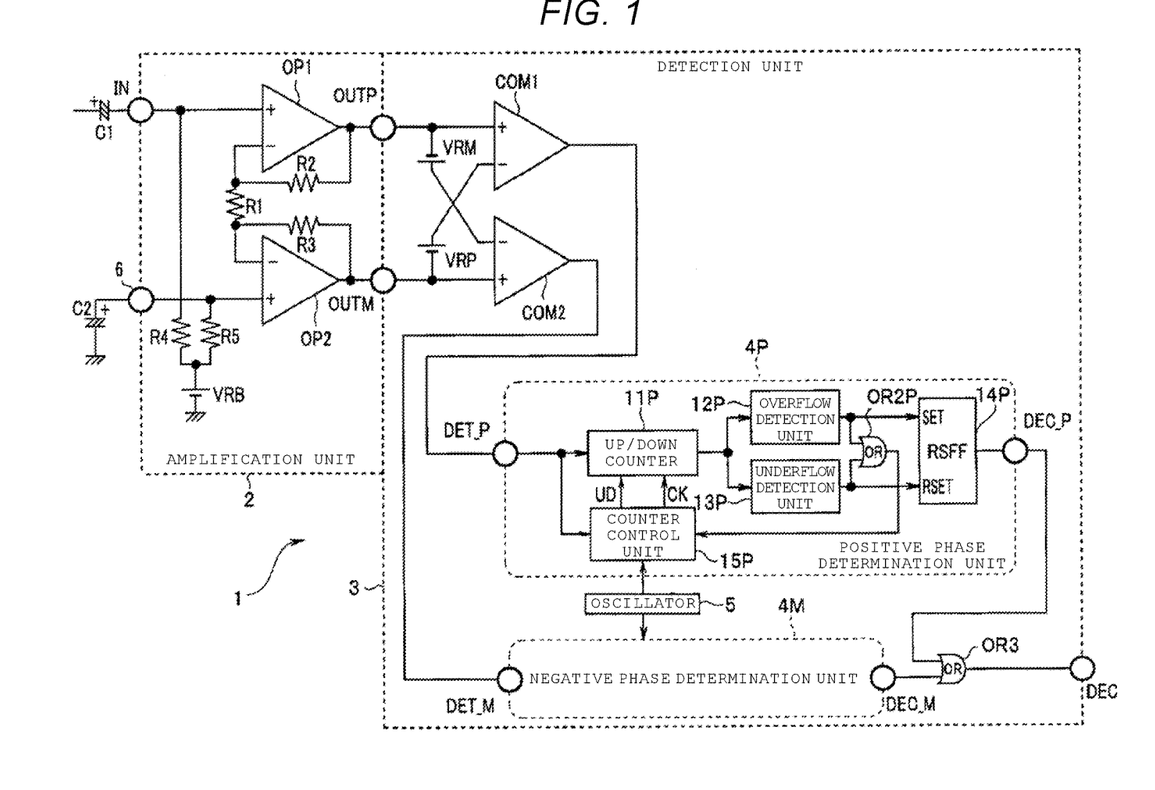
FIG. 1 is a circuit diagram showing an amplifier in which an offset detection circuit according to a first embodiment of the exemplary embodiment is incorporated.

FIG. 1 is a circuit diagram showing an amplifier 1 in which an offset detection circuit according to a first embodiment of the exemplary embodiment is incorporated. In addition, FIG. 2 is a block diagram showing an example of an audio system in which the amplifier 1 of FIG. 1 is incorporated.

Figure 2:
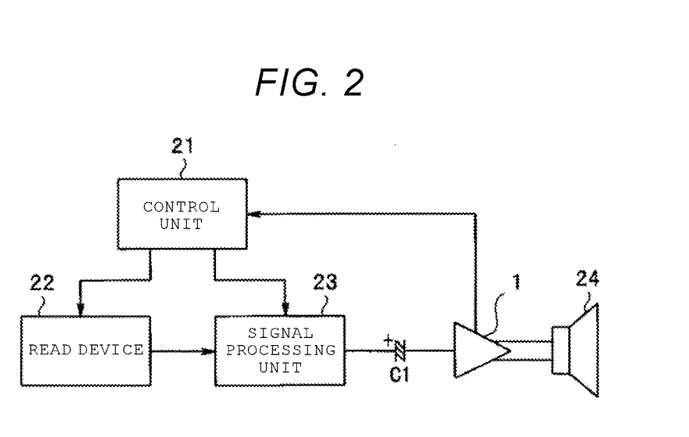
FIG. 2 is a block diagram showing an example of an audio system in which the amplifier of FIG. 1 is incorporated.

In FIG. 2, a control unit 21 can control the entirety of the system. The control unit 21 may be configured with a processor using a CPU (not shown) or the like, and may control each unit by being operated according to a program stored in a memory (not shown). A read device 22 is a driver that drives a storage medium such as a compact disc (CD), a digital versatile disc (DVD), a Blu-ray disc, a cassette tape, and an HDD recorder (not shown), reads audio information stored in the storage medium, and thereby outputs an audio signal to a signal processing unit 23 under control of the control unit 21.

The signal processing unit 23 is configured with an electronic volume, a digital signal processor (DSP), and the like, performs a predetermined signal process such as a high sound quality process on the received audio signal under the control of the control unit 21, and amplifies the audio signal at a predetermined amplification rate. The audio signal from the signal processing unit 23 is supplied to the amplifier 1, after a DC component is removed by a coupling capacitor C1. The amplifier 1 amplifies the received audio signal, and outputs the amplified audio signal to a speaker 24. Thus, audio is output from the speaker 24 as a sound.

In FIG. 1, the amplifier 1 is configured with an amplification unit 2 and a detection unit 3. The amplification unit 2 and the detection unit 3 may be integrated as an integrated circuit, and the entirety of the amplifier 1 may be configured on one chip.

An input terminal IN receives the audio signal that is an AC signal through the coupling capacitor C1. The input terminal IN is connected to a non-inverting (positive phase) input terminal of an amplifier OP1. The amplifier OP1 amplifies the received audio signal and obtains the audio signal of the positive phase. A non-inverting input terminal of an amplifier OP2 that obtains an audio signal of a negative phase is connected to a reference potential point through a negative input capacitor C2 connected to a terminal 6. The amplifier OP2 amplifies the received audio signal, and obtains the audio signal of the negative phase.

The non-inverting input terminal of the amplifier OP1 is connected to a positive polarity terminal of a power source VRB through a resistor R4, the non-inverting input terminal of the amplifier OP2 is connected to the positive polarity terminal of the power source VRB through a resistor R5, and a negative polarity terminal of the power source VRB is connected to the reference potential point. This arrangement causes a predetermined bias to be applied to the non-inverting input terminals of the amplifiers OP1 and OP2.

A resistor R2 is connected between an output terminal and an inverting (negative phase) input terminal of the amplifier OP1. The inverting input terminal of the amplifier OP1 is connected to the inverting input terminal of the amplifier OP2 through a resistor R1. A resistor R3 is connected between an output terminal and the inverting input terminal of the amplifier OP2.

A DC component of the audio signal that is input through the input terminal IN is removed by an input coupling capacitor C1, and the resultant audio signal is supplied to the non-inverting input terminal of the amplifier OP1. In addition, the non-inverting input terminal of the amplifier OP2 is connected to the reference potential point through the capacitor C2 so that a noise component is removed. The gain of the amplifier OP1 is determined by resistance values of the resistors R1 and R2, and the gain of the amplifier OP2 is determined by resistance values of the resistors R1 and R3.

The received audio signal is positively amplified by the amplifier OP1. By the virtual ground of the non-inverting input terminal and the inverting input terminal of the amplifier OP1, the same potential signal as the input audio signal is also applied to the inverting input terminal of the amplifier OP2. The received audio signal is negatively amplified by the amplifier OP2. Then, the amplifier OP1 outputs the audio signal with positive phase to a positive phase output terminal OUTP, and the amplifier OP2 outputs the audio signal with negative phase to a negative phase output terminal OUTM. Although not shown in FIG. 1, the audio signals with positive phase and negative phase respectively generated in output terminals OUTP and OUTM are supplied to the speaker 24 as output of the amplification unit 2.

A configuration of the amplification unit 2 is not limited to the configuration of FIG. 1. If a signal with positive phase is output to the positive phase output terminal OUTP and a signal with negative phase is output to the negative phase output terminal OUTM by a pair of amplifiers, any configuration may be implemented.

Next, before explaining the detection unit 3, a configuration and a problem of a DC offset detection circuit present in the related art will be described.

Typically, in a single-ended output power amplifier, by providing a DC blocking capacitor in an output terminal, a DC offset blocked from the speaker.

On the other hand, in a bridged transformer less (BTL) amplifier that has two power amplifiers whose outputs are connected to each other in a bridge manner and that obtains a doubled output due to the difference between the positive and negative outputs, because the same DC bias is applied to the positive and negative outputs, the DC blocking capacitor is not used.

However, there is a case where a DC offset that is large is included in output of the power amplifier due to leakage of a coupling capacitor connected to an input terminal of the power amplifier. Then, the offset detection circuit that detects the DC offset is used in the BTL amplifier in order to prevent damage to a speaker when the DC offset is large.

Figure 3:
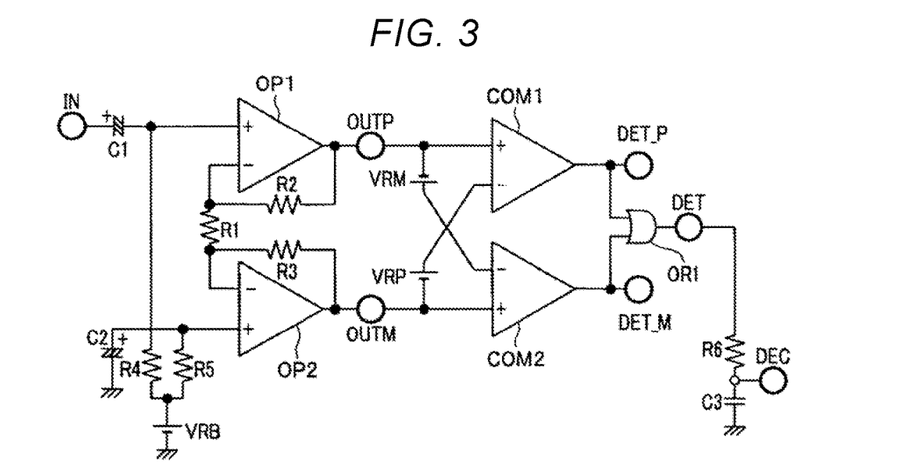
FIG. 3 is a circuit diagram showing a DC offset detection circuit adopted in a related art.

FIG. 3 is a circuit diagram showing an amplifier including the DC offset detection circuit used in the related art. In FIG. 3, a configuration of the BTL amplifier configured with the amplifier OP1, the amplifier OP2, and the like has the same configuration as the amplification unit 2 of FIG. 1. The audio signal with positive phase and the audio signal with negative phase are generated at output terminals OUTP and OUTM of the BTL amplifier, respectively. The positive phase output terminal OUTP is connected to a non-inverting input terminal of a comparator COM1. In addition, the positive phase output terminal OUTP is connected to a negative polarity terminal of the power source VRM that generates a detection threshold value VRM, and a positive polarity terminal of the power source VRM is connected to an inverting input terminal of the comparator COM2. An output terminal of the comparator COM1 is connected to a positive phase detection terminal DET_P.

Similarly, the negative phase output terminal OUTM is connected to a non-inverting input terminal of the comparator COM2. In addition, the positive phase output terminal OUTP is connected to a negative polarity terminal of a power source VRP that generates a detection threshold value VRP, and a positive polarity terminal of the power source VRP is connected to an inverting input terminal of the comparator COM1. An output terminal of the comparator COM2 is connected to a negative phase detection terminal DET_M.

The comparator COM1 outputs a detection result of the positive phase to the positive phase detection terminal DET_P, which becomes a high level (hereinafter, referred to as an H level) when a value obtained by subtracting the audio signal of the negative phase generated in the negative phase output terminal OUTM from the audio signal of the positive phase generated in the positive phase output terminal OUTP is higher than the detection threshold value VRP, and, otherwise, becomes a low level (hereinafter, referred to as an L level). In addition, the comparator COM2 outputs a detection result of the negative phase to the negative phase detection terminal DET_M, which becomes an H level when a value obtained by subtracting the audio signal of the negative phase generated in the negative phase output terminal OUTM from the audio signal of the positive phase generated in the positive phase output terminal OUTP is lower than the detection threshold value VRM, and, otherwise, becomes an L level. Outputs of the comparators COM1 and COM2 are provided to an OR circuit OR1, and the OR circuit OR1 outputs an output obtained by an OR operation on two inputs, to a detection terminal DET as the detection result.

Figure 4:
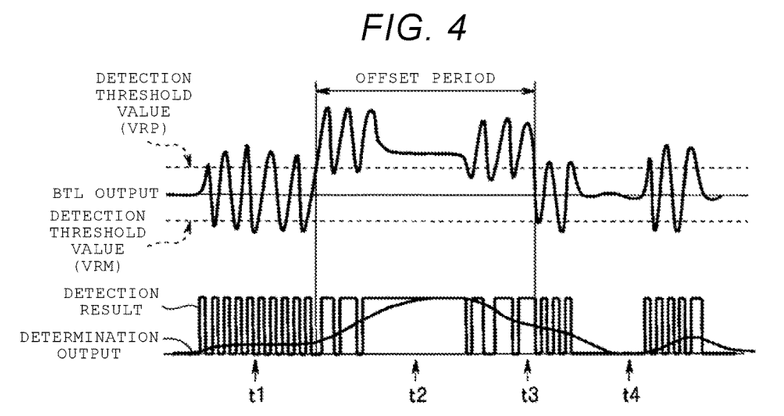
FIG. 4 is a timing chart showing a detection result in the related art.

FIG. 4 is a timing chart showing a detection result in the related art. In the following description, by using the signal obtained by subtracting the audio signal generated in the negative phase output terminal OUTM from the audio signal generated in the positive phase output terminal OUTP as a BTL output, an operation according to a waveform of the BTL output will be described. When the BTL output of FIG. 4 is greater than the detection threshold value VRP in a positive side, an output of the comparator COM1 becomes the H level, and when the BTL output is greater than the detection threshold value VRM in a negative side, an output of the comparator COM2 becomes the H level. Then, a detection result from the OR circuit OR1 becomes a pulse oscillating between H and L showing in FIG. 4.

The offset period depicted in FIG. 4 indicates that a DC offset is present in an output of the BTL amplifier due to the leakage of the input coupling capacitor C1 or the like. At a time t1 of FIG. 4, since a BTL output amplitude exceeds the detection threshold values VRP and VRM in a state where there is no offset, the detection result becomes a signal that frequently changes (oscillates) between the H level and the L level. The waveform at a time t2 of FIG. 4 indicates a state where the offset is present when there is no signal. In this case, it is possible to determine that the detection result is stable at the H level and indicates an offset. The waveform at a time t3 of FIG. 4 indicates a state where the offset is present when there is a signal. Since the BTL output has a portion which does not exceed the detection threshold values VRP and VRM, the detection result changes between an H level and an L level. The waveform at a time t4 of FIG. 4 indicates a state where there is no offset no signal. In this case, it is possible to determine that the detection result is stable at an L level and there is no offset.

The detection terminal DET of FIG. 3 is connected to the reference potential point through a low pass filter configured with a resistor R6 and a capacitor C3 that are connected in series. The detection result generated in the detection terminal DET is integrated by the low pass filter, and the integrated result of the detection result is generated in a connection point between the resistor R6 and the capacitor C3. The integrated result is output through a determination output terminal DEC as a determination output of the DC offset.

As shown in FIG. 4, the determination output generated in the determination output terminal DEC is a waveform that is relatively smooth even when the detection result generated in the detection terminal DET are frequently switched between an H level and an L level, and approximate offset determination can be performed even when there is a signal.

However, FIG. 4 shows an example in a case where an amplitude of the BTL output is a relatively small level slightly exceeding the detection threshold values VRP and VRM. When the amplitude of the BTL output is relatively great, for example, when an audio signal in the vicinity of a clip level is input, since the detection result generated in the detection terminal DET becomes an L level for a short time, and becomes an H level most of time, it is erroneously determined that there is the offset regardless of the presence or absence of the offset. In addition, FIG. 3 shows an example of the related art in which the low pass filter configured with the resistor R6 and the capacitor C3 is adopted. However, the low pass filter needs to be set to have cutoff characteristics sufficiently lower than that of the audio signal, which leads to increase in external components and cost.

In the related art of FIG. 3, for a process of the DC offsets generated in output of an amplification unit, a positive phase audio signal and a negative phase audio signal are respectively compared with detection threshold values, respective comparison results are combined through the OR circuit OR1 to obtain one detection result, and the determination output obtained based on the detection result is output through one determination output terminal DEC. That is, the related art of FIG. 3 has an advantage that it is possible to reduce the number of pins when being implemented as an integrated circuit.

However, in the related art of FIG. 3, the detection result generated in the detection terminal DET is used for determining both whether or not the BTL output exceeds a positive detection threshold value and a negative detection threshold value, and becomes an H level waveform most of time and an L level for a short time with respect to an input having a great amplitude. Therefore, there is a possibility that there is an erroneous output at the time of the great amplitude. A single-ended amplifier provided with a negative power source may not have a blocking capacitor and has a similar problem.

Alternatively, in the embodiment, respective DC offsets are determined based on the detection result obtained by comparing the BTL output and the positive detection threshold value and the detection result obtained by comparing the BTL output and the negative detection threshold value. Respective determination results are combined. Thereby, the determination output is output from one determination output terminal DEC. In this case, the low pass filter is not used in the determination of the DC offset, and this embodiment is improved with respect to circuit integration.

As shown in FIG. 1, in the embodiment, the detection unit 3 provides outputs of the comparators COM1 and COM2 serving as comparison units to the positive phase determination unit 4P and the negative phase determination unit 4M, respectively. Configurations of the power sources VRM and VRP and the comparators COM1 and COM2 are the same as those of FIG. 3, and the comparator COM1 outputs the detection result of the positive phase which becomes an H level when a signal obtained by subtracting the audio signal of the negative phase generated in the negative phase output terminal OUTM from the audio signal of the positive phase generated in the positive phase output terminal OUTP, that is, the BTL output is higher than the detection threshold value VRP, and, otherwise, becomes an L level. In addition, the comparator COM2 outputs the detection result of the negative phase which becomes an H level when the BTL output is lower than the detection threshold value VRM, and, otherwise, becomes an L level.

In the embodiment, the output of the comparator COM1 is provided to the positive phase detection terminal DET_P of the positive phase determination unit 4P. In addition, the output of the comparator COM2 is provided to the negative phase detection terminal DET_M of the negative phase determination unit 4M. As configurations of the positive phase determination unit 4P and the negative phase determination unit 4M are the same, the configuration of the negative phase determination unit 4M is not shown in FIG. 1. In the positive and negative phase determination units 4P and 4M, the same components are denoted by the same reference characters, and P or M is added to the reference characters of each component when it is necessary to distinguish each component of the positive phase determination unit 4P from each component of the negative phase determination unit 4M.

The detection result of the positive phase is provided to an up/down counter 11P of the positive phase determination unit 4P through the positive phase detection terminal DET_P. The detection result of the negative phase is provided to an up/down counter 11M of the negative phase determination unit 4M through the negative phase detection terminal DET_M. The detection result of the positive phase is also supplied to the counter control unit 15P. An oscillator 5 generates a predetermined frequency clock CK, and supplies the clock CK to the counter control units 15P and 15M of the positive phase determination unit 4P and the negative phase determination unit 4M. The counter control unit 15P supplies the clock CK to the up/down counter 11P, generates an up/down control signal UD for controlling incrementing and decrementing based on the detection result of the positive phase, and outputs the generated up/down control signal UD to the up/down counter 11P. In addition, the counter control unit 15M supplies the clock CK to the up/down counter 11M, generates the up/down control signal UD for controlling the incrementing and the decrementing based on the detection result of the negative phase, and outputs the generated up down control signal UD to the up/down counter 11M. The clock CK will be described below.

The up/down counter 11P increments in response to the clock CK during an H level period in the detection result of the positive phase, and decrements in response to the clock CK during an L level period in the detection result of the positive phase. A counted value obtained from the up/down counter 11P becomes greater when an H level period in the detection result of the positive phase is longer, and becomes smaller when an L level period is longer. The up/down counter 11M increments in response to the clock CK during an H level period in the detection result of the negative phase, and decrements in response to the clock CK during an L level period in the detection result of the negative phase. The counted value obtained from the up/down counter 11M becomes greater when an H level period in the detection result of the negative phase is longer, and becomes smaller when an L level period is longer. The counted value of the up/down counter 11 is supplied to an overflow detection unit 12 and an underflow detection unit 13.

The overflow detection unit 12 outputs an overflow detection result that is changed from an L level to an H level when the counted value of the up/down counter 11 overflows. The overflow detection unit 12 may determine that the overflow is generated, when the counted value of the up/down counter 11 is greater than a predetermined threshold value (hereinafter, referred to as overflow set value), and output the overflow detection result that is changed from the L level to the H level. That is, in the embodiment, the overflow means that the counted value of the up/down counter 11 reaches the overflow set value.

The underflow detection unit 13 outputs an underflow detection result that is changed from the L level to the H level when the counted value of the up/down counter 11 underflows. The underflow detection unit 13 may determine that the underflow is generated, when the counted value of the up/down counter 11 is smaller than a predetermined threshold value (hereinafter, referred to as underflow set value), and output the underflow detection result that is changed from an L level to an H level. That is, in the embodiment, the underflow means that the counted value of the up/down counter 11 reaches the underflow set value.

Figure 5A:
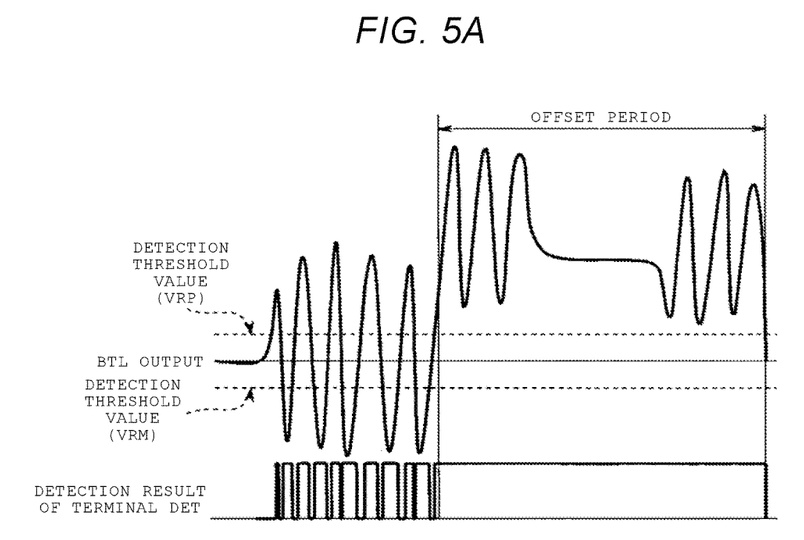
FIG. 5A is an explanatory diagram for explaining determination of a positive phase determination unit and a negative phase determination unit.
Figure 5B:
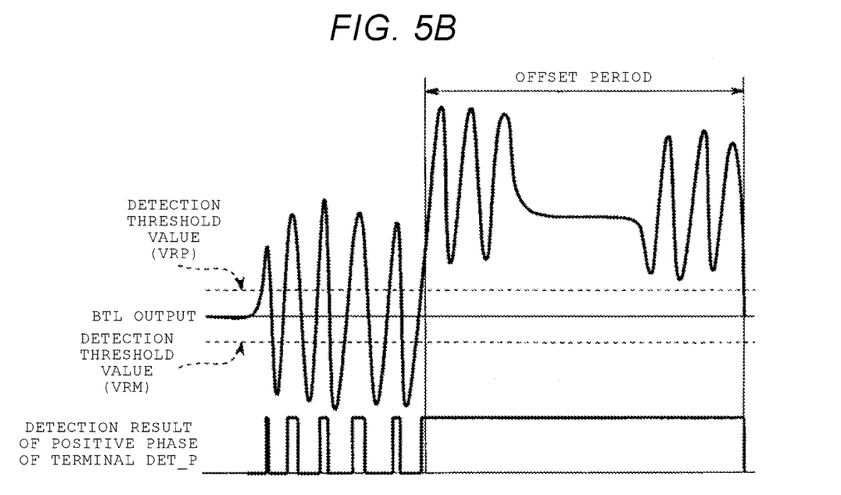
FIG. 5B is an explanatory diagram for explaining the determination of the positive phase determination unit and the negative phase determination unit.

FIG. 5A and FIG. 5B are explanatory diagrams for explaining determination by the positive phase determination unit 4P and the negative phase determination unit 4M. FIG. 5A and FIG. 5B show examples in which a level of the BTL output is extremely great. FIG. 5A shows the detection result that is output from the detection terminal DET in the related art of FIG. 3, and FIG. 5B shows the detection result of the positive phase that is output from the positive phase detection terminal DET_P of FIG. 1. The detection result in the related art of FIG. 3 is obtained by the OR operation on outputs of the comparators COM1 and COM2, and, as described above, becomes an H level most of time when the level of the BTL output is great. Therefore, as described above, even during a period in which there is no offset the level of the determination output from the determination output terminal DEC is high, and it is erroneously determined that there is an offset.

On the other hand, as shown in FIG. 5B, if, in the detection result of the positive phase that is output from the positive phase detection terminal DET_P, an L level period is longer on average than an H level period, then a determination of an offset is not generated. However, during the offset period, an H level is correctly maintained most of time. The same is also applied to the detection result of the negative phase that is output from the negative phase detection terminal DET_M. Thus, during a period in which the offset is present, the counted value of the up/down counter 11 reaches the overflow set value, and during a period in which there is no offset, the counted value of the up/down counter 11 does not reach the overflow set value.

In the embodiment, the positive phase and negative phase determination units 4P and 4M determine that the offset is present when the counted value of the up/down counter 11 is greater than the overflow set value, and the units determine that the offset is not present when the counted value of the up/down counter 11 is smaller than the underflow set value. That is, the overflow detection result from the overflow detection unit 12 indicates determination that the offset is present, and the underflow detection result from the underflow detection unit 13 indicates determination that the offset is not present.

The overflow detection result from the overflow detection unit 12 is supplied to an input terminal of an OR circuit OR2, also supplied to a set terminal SET of an RS flip-flop (RSFF) 14. In addition, the underflow detection result from the underflow detection unit 13 is supplied to the input terminal of the OR circuit OR2, also supplied to a reset terminal RSET of the RS flip-flop (RSFF) 14.

The RSFF 14P outputs a determination result of the positive phase of an H level based on the overflow detection result of an H level supplied to the set terminal SET, and outputs the determination result of the positive phase of an L level based on the underflow detection result of an H level supplied to the reset terminal RSET. The determination result of the positive phase of an H level from the RSFF 14P indicates that the input signal is in an offset period, and the determination result of the positive phase of an L level from the RSFF 14P indicates that the input signal is not in an offset period. Output of the RSFF 14P is output from a positive phase determination terminal DEC_P as the determination output of the positive phase.

Similarly, the RSFF 14M outputs the determination result of the negative phase of an H level based on the overflow detection result of an H level supplied to the set terminal SET, and outputs the determination result of the negative phase of an L level based on the underflow detection result of an H level supplied to the reset terminal RSET. The determination result of the negative phase of an H level from the RSFF 14M indicates that the input signal is in an offset period, and the determination result of the negative phase of an L level from the RSFF 14M indicates that the input signal is not in an offset period. Output of the RSFF 14M is provided from the negative phase determination terminal DEC_M as the determination output of the negative phase.

When the overflow detection result of an H level or the underflow detection result of an H level is input, the OR circuit OR2 outputs a stop signal to the count control unit 15 so that the up/down counter 11 does not increment/decrement further. The count control unit 15 stops the clock CK when receiving the stop signal. When the clock CK is stopped by the overflow detection result, the value of the up/down counter 11 is maintained at the overflow set value. In this state, when the detection result of the positive phase or the negative phase that is input to the count control unit 15 is changed to an L level, the count control unit 15 restarts supply of the clock CK and the up/down counter 11 starts decrementing. In addition, when the clock CK is stopped by the underflow detection result, the counted value of the up/down counter 11 is fixed at the underflow set value. In this state, when the detection result of the positive phase or the negative phase that is input to the count control unit 15 is changed to an H level, the count control unit 15 restarts the supply of the clock CK and the up/down counter 11 restarts incrementing.

As described above, the detection result of the positive phase becomes an H level during a relative long period and the counted value reaches the overflow set value so that the positive phase determination unit 4P determines that the offset is present. In addition, the detection result of the negative phase becomes an H level during a relative long period and the counted value reaches the overflow set value so that the negative phase determination unit 4M determines that the offset is present. In this case, the length of time that an H level needs to be maintained until the counted value reaches the overflow set value is determined based on a cycle of the clock CK, with respect to a BTL output cycle, that is, an audio signal cycle and the overflow set value.

In order to reliably perform comparison with the detection threshold value for every one cycle of the BTL output, it is preferable that a frequency of the clock CK from the oscillator 5 is equal to or greater than that of twice of an input audio signal bandwidth. For example, an oscillation frequency (frequency of clock CK) of the oscillator 5 is set to 60 KHz. Meanwhile, since the up/down counter 11 increments in response to the clock CK during a period in which the BTL output exceeds the detection threshold value, even when the DC offset is not generated, the counted value increases as a cycle of the audio signal is longer. When the DC offset is not generated, the number of bits of the up/down counter 11 is determined by considering a case where the BTL output is 20 Hz, which frequency is designated as the lowest value of the audible frequency that does not overflow the counted value of the up/down counter 11.

That is, the up/down counter 11 may be implemented if the counted value of (½0 Hz)/(⅙0 KHz)=3,000 counts or more can be output. For example, as the up/down counter 11, a 12-bit counter capable of counting 4,096 may be adopted.

The clock CK of a frequency equal to or greater than that of twice of the input audio signal bandwidth is not required at all times. The clock frequency may be lowered to perform an under-sampling operation, and it is not necessary that the maximum counts of the up/down counter 11 be set to the counted value equal to or greater than 3,000 counts described above at all times.

The determination output of the positive phase that is output from the positive phase determination terminal DEC_P and the determination output of the negative phase that is output from the negative phase determination terminal DEC_M are input to an OR circuit OR3. The OR circuit OR3 serving as an output unit provides, as the determination output, an operation result obtained by performing the OR operation on two inputs, to the determination output terminal DEC. The determination output that is provided to the determination output terminal DEC is supplied to the control unit 21 of FIG. 2.

The control unit 21 may, for example, shut down a system when it is indicated that the DC offset is present in the output of the amplification unit 2 by the determination output.

Next, an operation of the embodiment configured in this manner will be described with reference to timing charts of FIG. 6 and FIG. 7.

The input audio signal through the input terminal IN is amplified by the amplifiers OP1 and OP2, and the audio signal of the positive phase and the audio signal of the negative phase are generated in output terminals of operational amplifiers OP1 and OP2. The comparator COM1 outputs the detection result of the positive phase which becomes an H level when the BTL output is higher than the detection threshold value VRP, and, otherwise, becomes an L level, to the positive phase detection terminal DET_P. As shown in FIG. 6, the detection result of the positive phase shown by a solid line with respect to the BTL output can be obtained.

In addition, the comparator COM2 outputs the detection result of the negative phase which becomes an H level when the BTL output is lower than the detection threshold value VRM, and, otherwise, becomes an L level, to the negative phase detection terminal DET_M. As shown in FIG. 6, the detection result of the negative phase is shown by a broken line with respect to the BTL output.

The detection result of the positive phase is provided to the up/down counter 11P of the positive phase determination unit 4P. The up/down counter 11P starts the incrementing when the BTL output exceeds the detection threshold value VRP and therefore the detection result of the positive phase becomes an H level, and starts the decrementing when the BTL output is lower than the detection threshold value VRP and therefore the detection result of the positive phase becomes an L level. The counted value of the positive phase determination unit 4P in FIG. 6 shows the counted value of the up/down counter 11P in this case. The overflow detection unit 12P or the underflow detection unit 13P determine respectively whether or not the counted value of the up/down counter 11P reaches the overflow set value or the underflow set value.

Figure 6:
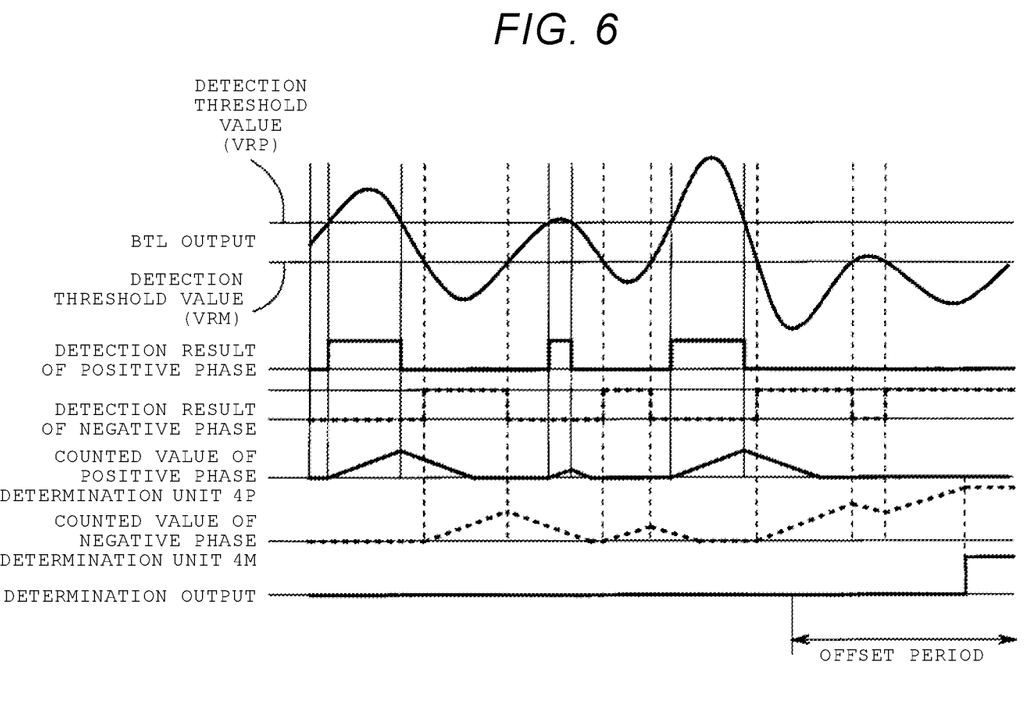
FIG. 6 is a timing chart for explaining a second embodiment.

In an example of FIG. 6, the overflow detection unit 12P does not output the overflow detection result of the H level, because the counted value of the up/down counter 11P does not reach the overflow set value. Meanwhile, the counted value of the up/down counter 11P reaches the underflow set value, so that the underflow detection unit 13P outputs the underflow detection result of an H level. In this case, the determination result of the positive phase indicating that the offset is not present is output from the positive phase determination terminal DEC_P. In addition, the counter control unit 15P stops generation of the clock CK based on the underflow detection result, and the counted value of the up/down counter 11P maintains the underflow set value. When the BTL output increases and exceeds the detection threshold value VRP, the detection result of the positive phase becomes the H level again, and the counter control unit 15P restarts the supply of the clock CK, and the up/down counter 11P restarts incrementing the clock CK.

Subsequently, the same operation is repeated. However, the counted value of the up/down counter 11P does not reach the overflow set value during the entire period of FIG. 6.

The detection result of the negative phase is provided to the up/down counter 11M of the negative phase determination unit 4M. The up/down counter 11M starts the incrementing when the BTL output exceeds the detection threshold value VRM and therefore the detection result of the negative phase becomes an H level, and starts the decrementing when the BTL output is greater than the detection threshold value VRM and therefore the detection result of the negative phase becomes an L level. The counted value of the negative phase determination unit 4M of FIG. 6 shows the counted value of the up/down counter 11M in this case. The overflow detection unit 12M or the underflow detection unit 13M, respectively determine whether or not the counted value of the up/down counter 11M reaches the overflow set value or the underflow set value.

In an example of FIG. 6, until the offset is present, the counted value of the up/down counter 11M does not reach the overflow set value, and the overflow detection unit 12M does not output the overflow detection result of an H level. Meanwhile, the counted value of the up/down counter 11M reaches the underflow set value, and the underflow detection unit 13M outputs the underflow detection result of an H level. In this case, the determination result of the negative phase indicating that the offset is not generated is output from the negative phase determination terminal DEC_M. In addition, the counter control unit 15M stops the generation of the clock CK based on the underflow detection result, and the counted value of the up/down counter 11M maintains the underflow set value. When the BTL output decreases and exceeds the detection threshold value VRM, the detection result of the negative phase becomes an H level again, and the counter control unit 15M restarts the supply of the clock CK, so that the up/down counter 11M restarts incrementing the clock CK.

The offset period of FIG. 6 indicates a period during which the offset is present in the BTL output. When the offset is present, a period during which the BTL output exceeds the detection threshold value VRM becomes long, and the H level period in the detection result of the negative phase becomes long, so that the counted value of the up/down counter 11M increases and reaches the overflow set value. The overflow detection unit 12M then outputs the overflow detection result of an H level. By this overflow detection result, the RSFF 14M outputs the determination result of the negative phase as an H level to the negative phase determination terminal DEC_M.

The OR circuit OR3 performs the OR operation on the determination result of the positive phase generated in the positive phase determination terminal DEC_P and the determination result of the negative phase generated in the negative phase determination terminal DEC_M, and outputs the operation result as the determination output. Thus, as shown in FIG. 6, after a predetermined period (hereinafter, referred to as determination period) elapses from start of the offset period, the determination output of the H level indicating that the offset is present is output.

When the counted value reaches the overflow set value, the counter control unit 15M stops the generation of the clock CK based on the overflow detection result, and the counted value of the up/down counter 11M maintains the overflow set value. When the BTL output increases and becomes greater than the detection threshold value VRM, the detection result of the negative phase becomes an L level again, and the counter control unit 15M restarts the supply of the clock CK, so that the up/down counter 11M restarts decrementing the clock CK. In this case as well, the RSFF 14 maintains the determination result of an H level until the underflow detection result of an H level is input to the reset terminal RSET. When the counted value of the up/down counter 11M reaches the underflow set value, the RSFF 14 is reset by the underflow detection result of an H level, and changes the determination result to an L level indicating that the offset is not present.

Figure 7:
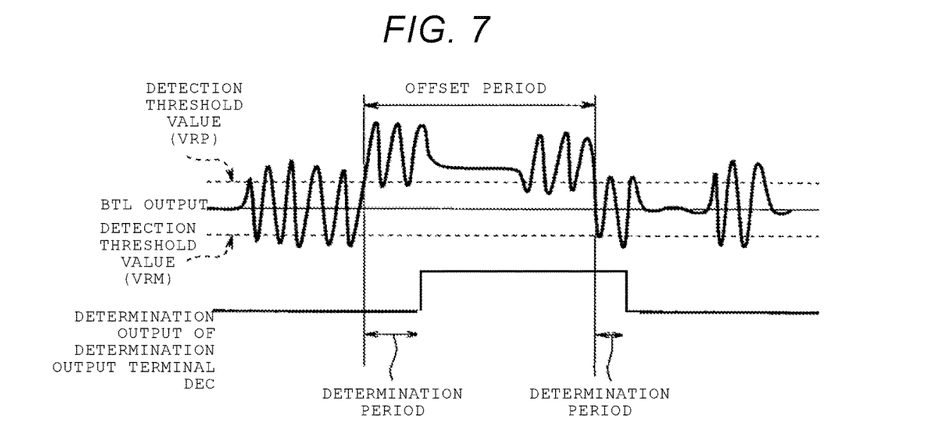
FIG. 7 is a timing chart for explaining the second embodiment.

FIG. 7 is a timing chart for explaining the determination period. In the embodiment, the counted value exceeds the overflow set value and thereby the determination result indicating that the offset is present is obtained, and the counted value that reaches the overflow set value reaches the underflow set value and thereby the determination result indicating that the offset is not present is obtained. Accordingly, as shown in FIG. 7, even though the offset is present, a predetermined determination period is necessary until the determination result indicates the presence of the offset. In addition, similarly, even though the offset is not present, a predetermined determination period is necessary until the determination result indicates absence the offset. The determination period is determined by the frequency of the clock CK and the overflow set value or the underflow set value. FIG. 7 shows an example in which by changing a count increment amount of the incrementing per one clock CK and a count decrement amount of the decrementing per one clock CK, the determination period for detecting absence of the offset is shorter than the determination period for detecting presence of the offset.

In the embodiment, the detection result of the positive phase indicating whether or not the BTL output exceeds the positive detection threshold value, and the detection result of the negative phase indicating whether or not the BTL output exceeds the negative detection threshold value are provided respectively, respective DC offsets are determined and respective determination results are combined so that the determination output is performed from one determination output terminal DEC. During a period in which the offset is not present, a period during which the BTL output exceeds the positive detection threshold value is shorter than other periods. In addition, a period during which the BTL output exceeds the negative detection threshold value is shorter than other periods. Accordingly, since determination of the DC offset is separately performed with respect to the detection result of the positive phase and the detection result of the negative phase, there is no case where an erroneous determination that the offset is present when the offset is not present. In addition, when the offset is present, since a time during which the BTL output exceeds the positive detection threshold value or the negative detection threshold value increases, it is possible to reliably detect the offset. With this, even when an AC signal is being input, it is possible to accurately determine the offset at any time. That is, in an acoustic system, even when the audio signal is being reproduced, it is possible to detect the presence of the offset. With this, it is possible to reliably prevent the speaker to which output of the amplifier is supplied, from damage. Moreover, since the determination of the offset is performed by counting the period during which the positive and negative detection results exceed the detection threshold values and by comparing the counted values, the low pass filter or the like for obtaining the determination result is not necessary, and this improves implementation in an integrated circuit. In addition, the determination results of the positive phase and the negative phase are combined and a combined result is output from one determination output terminal, so that it is possible to prevent increase of the number of pins. That is, since no external filter or the like is required and all components can be provided in one chip IC, it is possible to provide the embodiment at a low cost.

Second Embodiment

Figure 8:
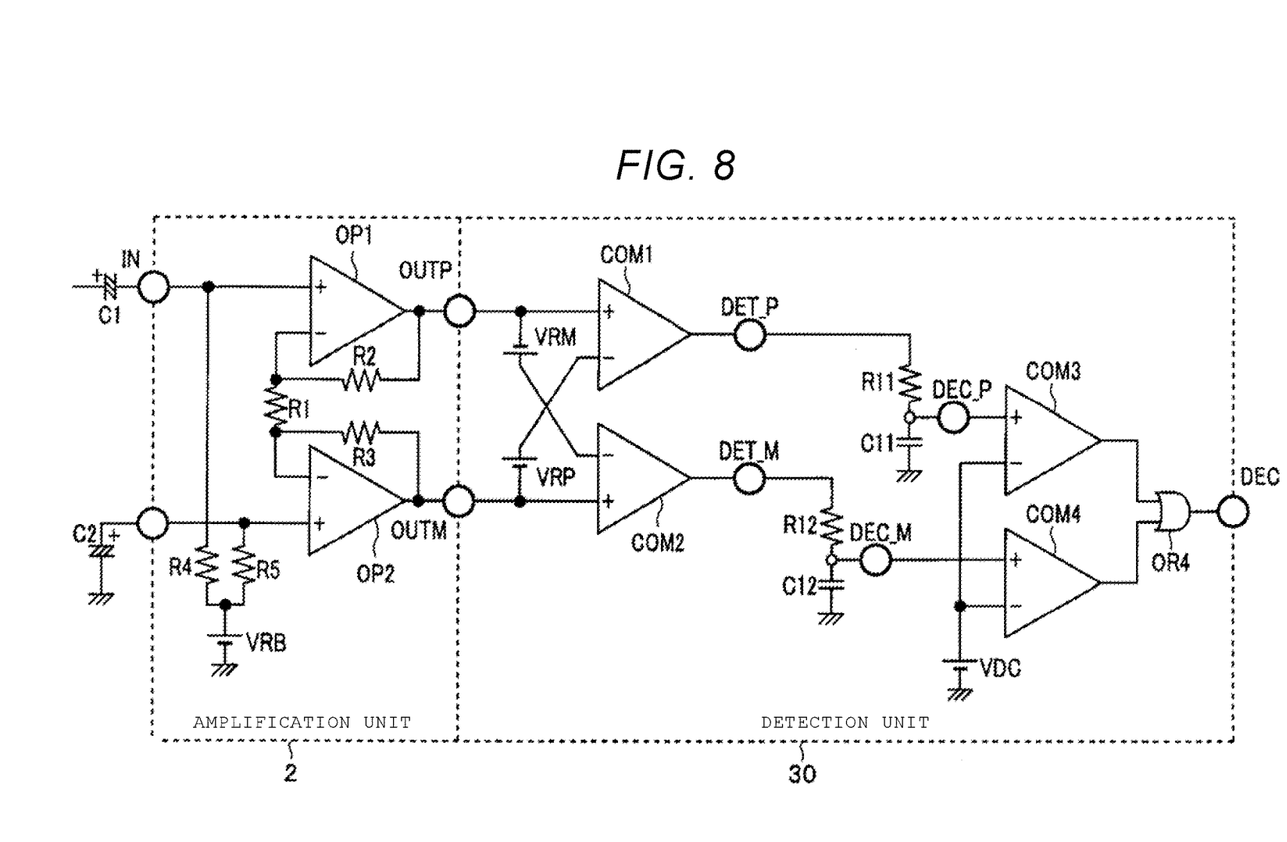
FIG. 8 is a circuit diagram showing the second embodiment of the exemplary embodiment.

FIG. 8 is a circuit diagram showing a second embodiment of the exemplary embodiment. In the first embodiment, detection of the DC offset is performed in a digital manner by using the counter. However, if each of the DC offsets is determined based on the detection result of the positive phase audio signal and the positive detection threshold value, and the detection result of the negative phase audio signal and the negative detection threshold value, reliable detection of the offset can be performed, and the detection of the offset may be performed in an analog manner.

The offset detection circuit of FIG. 8 is different from the offset detection circuit of FIG. 1 in that the detection unit 30 is adopted instead of the detection unit 3. The detection unit 30 is different from the detection unit 3 of FIG. 1 in that the low pass filter configured with a resistor R11 and a capacitor C11, and the low pass filter configured with a resistor R12 and a capacitor C12, comparators COM3 and COM4 and an OR circuit OR4 are adopted instead of the positive phase determination unit 4P, the negative phase determination unit 4M, the oscillator 5, and the OR circuit OR3.

The positive phase detection terminal DET_P is connected to the reference potential point through the resistor R11 and the capacitor C11, and a connection point of the resistor R11 and the capacitor C11 is connected to the positive phase determination terminal DEC_P. In addition, the negative phase detection terminal DET_M is connected to the reference potential point through the resistor R12 and the capacitor C12, and a connection point of the resistor R12 and the capacitor C12 is connected to the negative phase determination terminal DEC_M.

The low pass filter configured with the resistor R11 and the capacitor C11 integrates the detection result of the positive phase generated in the positive phase detection terminal DET_P. The integrated result is output through the positive phase determination terminal DEC_P as the determination result of the positive phase of the DC offset. In addition, the low pass filter configured with the resistor R12 and the capacitor C12 integrates the detection result of the negative phase generated in the negative phase detection terminal DET_M. The integrated result is output through the negative phase determination terminal DEC_M as the determination result of the negative phase of the DC offset. The comparator COM3 generates a digital output by comparing the determination result of the positive phase with a threshold value voltage VDC, and the comparator COM4 generates a digital output by comparing the determination result of the negative phase with the threshold value VDC. The OR circuit OR4 performs the OR operation on the determination results of the positive phase and the negative phase from the comparators COM3 and COM4, and outputs the operation result as the determination output through the determination output terminal DEC.

In the embodiment configured in this manner, the determination of the DC offset is performed by the low pass filter. As shown in FIG. 5B, in the detection result of the positive phase that is output from the positive phase detection terminal DET_P and the detection result of the negative phase that is output from the negative phase detection terminal DET_M, the L level period is longer than the H level period on average if the offset is not present, and the H level is maintained most of time during an offset period. Accordingly, during the period in which the offset is not present, regardless of the level of the BTL output, all of the determination results of the positive phase and the negative phase obtained by the low pass filter by the resistor R11 and the capacitor C11 and the low pass filter by the resistor R12 and the capacitor C12 do not become values greater than a predetermined threshold value (VDC). Meanwhile, during the period in which the offset is present, one of the determination results of the positive phase and the negative phase becomes a value greater than the predetermined threshold value (VDC).

The OR circuit OR4 outputs an OR operation result, as the determination output, on the determination results of the positive phase and the negative phase from the determination output terminal DEC. Accordingly, the determination output becomes an H level during only a period when the DC offset is present, and thereby it is possible to reliably detect the DC offset.

In the embodiment as well, it is possible to accurately perform the offset determination at any time even when the AC signal is being input.

Third Embodiment

Figure 9:
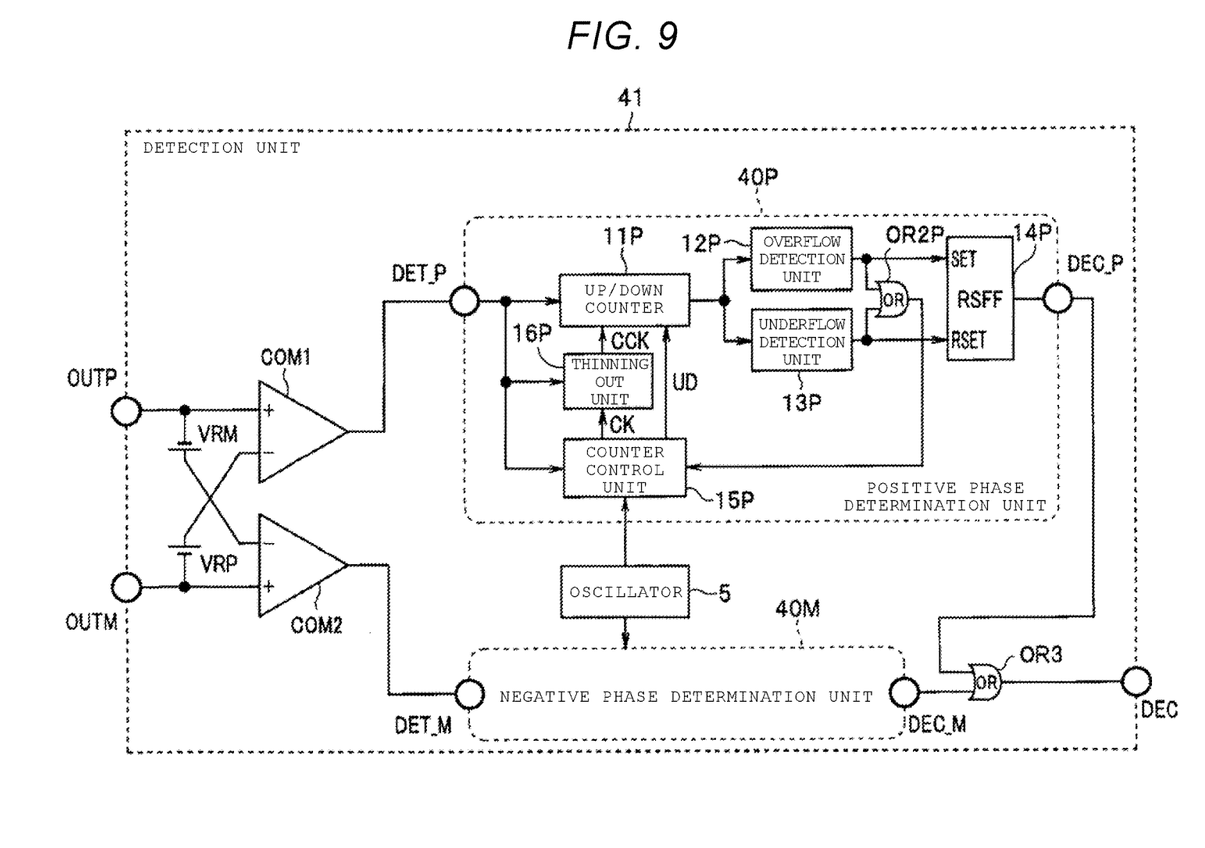
FIG. 9 is a circuit diagram showing a third embodiment of the exemplary embodiment.

FIG. 9 is a circuit diagram showing a third embodiment of the exemplary embodiment. In a configuration of the amplification unit 2 in the embodiment, the same description as that of FIG. 1 is not shown. In FIG. 9, the same components as those in FIG. 1 will be denoted by the same reference characters, and descriptions thereof will be omitted.

A period during which the BTL output exceeds the detection threshold value VRP or VRM: becomes a period shorter than the half of the BTL output cycle at any time when the offset is not generated in the BTL output. That is, in the first and second embodiments, if the DC offset is not present, since a duty ratio of the period during which the BTL output exceeds the detection threshold value becomes a duty ratio less than 50%, it is possible to prevent erroneous detection of the DC offset.

However, the case in which this condition is not satisfied for some reason is now considered. For example, when an amplitude of the audio signal is great, and the BTL output is clipped, or the like, it is assumed that a ratio of the period during which the BTL output exceeds the detection threshold value becomes great, and a margin of the erroneous detection becomes small. Furthermore, when amplification of the amplifiers OP1 and OP2 is performed non-linearly, it is assumed that the BTL output is distorted, and a duty ratio between a positive period and a negative period is relatively greatly changed. In this case, it is possible that the duty ratio of the period during which the BTL output exceeds the detection threshold value exceeds 50%, even when the DC offset is not present.

Then, in the embodiment, by decreasing the counted value of the up/down counter 11 corresponding to the period during which the BTL output exceeds the detection threshold value, the erroneous detection of the DC offset can be reliably prevented.

A detection unit 41 of FIG. 9 adopts a positive phase determination unit 40P to which a thinning-out unit 16P is added and a negative phase determination unit 40M to which a thinning-out unit 16M (not shown) is added, instead of the positive phase determination unit 4P and the negative phase determination unit 4M of FIG. 1. Configurations of the positive phase determination unit 40P and the negative phase determination unit 40M are the same, and the thinning-out units 16P and 16M are referred to as thinning-out units 16 when the thinning-out units 16P and 16M are not distinguished from each other.

The clock CK is provided from the count control unit 15 to the thinning-out unit 16. The thinning-out unit 16 generates a clock CCK by thinning out the clock CK and supplies the generated clock CCK to the up/down counter 11, during a predetermined period during which the period during which the BTL output exceeds the detection threshold value, that is, the detection result of the positive phase or the negative phase becomes the H level. The up/down counter 11 increments in response to the clock CCK during the period in which the detection result of the positive phase or the negative phase becomes the H level.

For example, the thinning-out unit 16 may operate in a period during which the clock CK is thinned out by performing an AND operation on a reduction signal obtained by dividing (for example, dividing by 32) the clock CK and the detection result of the positive phase or the negative phase, and may generate the clock CCK by thinning out the clock CK in the thinning-out period. That is, it is possible to decrease the counted value of the up/down counter 11 by the number of the clocks CK in the thinning-out period.

Since the audio signal that is input and the oscillator 5 are operated asynchronously or the number of stages of the up/down counter 11 is sufficiently great, the reduction signal is randomly generated during the period in which the BTL output exceeds the detection threshold value. With this, when the DC offset is not present, although waveform distortion occurs in the BTL output or the like, reaching the overflow set value is reliably prevented by decreasing the counted value of the up/down counter 11.

In a case of an ordinary audio signal, there is little possibility that the input audio signal and the clock CK are continuously synchronized with each other during the H level period in the detection result of the positive phase or the negative phase. However, when the reduction signal is continuously generated during the L level period in the detection result of the positive phase or the negative phase, the thinning-out unit 16 may generate the clock CCK from which the clock CK is thinned out, by forcibly generating a thinning-out period in a next H level period.

Next, an operation of the embodiment configured in this manner will be described with reference to a timing chart of FIG. 10.

The clock CK from the count control unit 15 is supplied to the thinning-out unit 16. For example, the thinning-out unit 16 generates the reduction signal by dividing the clock CK. FIG. 10 shows this example, and the reduction signal is generated in a predetermined cycle.

The thinning-out unit 16 obtains the thinning-out period indicating a period during which the clock CK is thinned out in the period during which the BTL output exceeds the detection threshold value, by using the reduction signal and the detection result of the positive phase or the negative phase. As shown in FIG. 10, the detection result of the positive phase becomes the H level, when the BTL output exceeds the detection threshold value VRP, and the detection result becomes the L level during other periods. The thinning-out unit 16 generates the thinning-out period by the AND operation on the detection result of the positive phase or the negative phase and the reduction signal.

Figure 10:
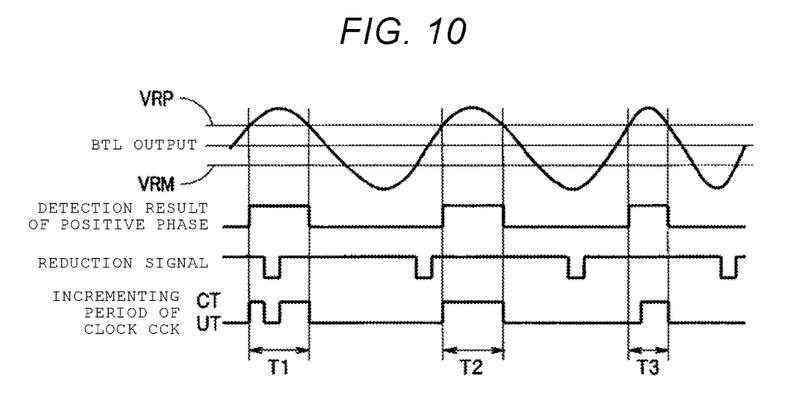
FIG. 10 is a timing chart for explaining an operation of the third embodiment.

Accordingly, the thinning-out period becomes a period shown as UT during periods T1 to T3 of FIG. 10. The clock CCK obtained by thinning out the clock CK is supplied to the up/down counter 11 during the thinning-out period. A period shown as CT in each of periods T1 to T3 of FIG. 10 is a period during which the incrementing is performed, and a period shown as UT is a period during which the incrementing stops. During a period other than each of periods T1 to T3 of FIG. 10, the up/down counter 11 decrements in response to the clock CCK.

As shown in FIG. 10, when the reduction signal is generated twice in succession during the L level period in the detection result of the positive phase or the negative phase, the thinning-out unit 16 forcibly sets the thinning-out period during the next period T3, and supplies the clock CCK obtained by thinning out the clock CK, to the up/down counter 11. With this, even when the reduction signal is randomly generated, it is possible to reliably prevent erroneous detection of the offset.

By the thinning-out period, incrementing the up/down counter 11 is reduced, and even when waveform distortion or the like occurs in the BTL output, if the offset is not present, the counted value does not reach the overflow set value.

In the embodiment as well, it is possible to obtain the same effect as the first embodiment. Furthermore, in the embodiment, the counted value of the up/down counter is reduced, and even when waveform distortion or the like occurs in the BTL output, if the offset is not present, it is possible to reliably prevent the erroneous detection of the offset.

While certain embodiments have been described, these embodiments have been presented by way of example only, and are not intended to limit the scope of the exemplary embodiments. Indeed, the novel embodiments described herein may be embodied in a variety of other forms; furthermore, various omissions, substitutions and changes in the form of the embodiments described herein may be made without departing from the spirit of the exemplary embodiments. The accompanying claims and their equivalents are intended to cover such forms or modifications as would fall within the scope and spirit of the exemplary embodiments.

For example, in each of the embodiments described above, an example in which a BTL configuration amplifier is employed as an amplifier has been described, but the same can also be applied to a single-ended amplifier. In addition, the above-described embodiment includes exemplary embodiments at various stages, and various exemplary embodiments can be extracted by an appropriate combination of a plurality of disclosed constitutional requirements. For example, even if some constituent requirements are deleted from all the constituent requirements shown in the embodiment, the problem described in the section of the problem to be solved by the exemplary embodiment can be solved and the effect described in the effect of the exemplary embodiment can be obtained, and a configuration in which the constituent requirements are deleted can be extracted as an exemplary embodiment.

What is claimed is:

1. An offset detection circuit, comprising:
   a comparison unit connected to an output of an amplifier that amplifies an input signal and configured to generate a first comparison result between the output of the amplifier and a positive detection threshold value, and a second comparison result between the output of the amplifier and a negative detection threshold value;
   a first determination unit configured to generate a first offset determination result of two values indicating presence or absence of an offset according to a period during which the output of the amplifier exceeds the positive detection threshold value, based on the first comparison result;
   a second determination unit configured to generate a second offset determination result of two values indicating the presence or absence of an offset according to a period during which the output of the amplifier exceeds the negative detection threshold value, based on the second comparison result; and
   an output unit configured to generate a determination output of the offset based on the first and second offset determination results.

2. The circuit according to claim 1,
   wherein the amplifier is configured to output a differential output of positive polarity and negative polarity as the output, and
   wherein the comparison unit is configured to generate the first comparison result between the differential output and the positive detection threshold value, and the second comparison result between the differential output and the negative detection threshold value.

3. The circuit according to claim 1,
wherein the first determination unit includes:
a first counter which counts a period during which the output exceeds the positive detection threshold value, and
a first detection unit configured to generate the first offset determination result based on a counted value of the first counter, and
wherein the second determination unit includes:
a second counter which counts a period during which the output exceeds the negative detection threshold value, and
a second detection unit configured to generate the second offset determination result based on a counted value of the second counter.

4. The circuit according to claim 3,
wherein the first determination unit stops counting of the first counter for a predetermined period during the period in which the output exceeds the positive detection threshold value, and
wherein the second determination unit stops counting of the second counter for a predetermined period during the period in which the output exceeds the negative detection threshold value.

5. The circuit according to claim 3,
wherein the first counter is an up/down counter which increments during the period in which the output exceeds the positive detection threshold value, and decrements during other periods, and
wherein the second counter is the up/down counter which increments during the period in which the output exceeds the negative detection threshold value, and decrements during other periods.

6. The circuit according to claim 5,
wherein the first detection unit includes:
a first overflow detection unit configured to detect that the counted value of the first counter exceeds a predetermined overflow set value,
a first underflow detection unit configured to detect that the counted value of the first counter exceeds a predetermined underflow set value, and
a first flip-flop configured to generate the first offset determination result of which a level is changed based on the detection results of the first overflow detection unit and the first underflow detection unit, and
wherein the second detection unit includes:
a second overflow detection unit configured to detect that the counted value of the second counter exceeds a predetermined overflow set value,
a second underflow detection unit configure to detect that the counted value of the second counter exceeds a predetermined underflow set value, and
a second flip-flop configured to generate the second offset determination result of which a level is changed based on the detection results of the second overflow detection unit and the second underflow detection unit.

7. The circuit according to claim 1, wherein the output unit is configured to generate the determination output by an OR operation on the first and the second offset determination results.

8. The circuit according to claim 1,
wherein the first determination unit includes a first filter which performs integration during the period in which the output exceeds the positive detection threshold value, and
wherein the second determination unit includes a second filter which performs integration during the period in which the output exceeds the negative detection threshold value.

9. An offset detection circuit, comprising:
an offset detection comparator configured to compare an audio signal to a fixed voltage to provide at an output thereof a detection signal that indicates whether or not the audio signal has exceeded the fixed voltage; and
a determination unit connected to receive the detection signal from the offset detection comparator, the determination unit including:
an up/down counter in which a count value increments in response to a clock signal while the detection signal indicates that the audio signal has exceeded the fixed voltage, and in which the count value decrements in response to the clock signal while the detection signal indicates that the audio signal has not exceeded the fixed voltage, and
an overflow detection unit and an underflow detection unit that detects when the count value reaches an overflow or an underflow, respectively, the overflow indicating that an offset is present in the audio signal, and the underflow indicating that the offset is not present in the audio signal.

10. The offset detection circuit according to claim 9, further comprising an oscillator that generates the clock signal.

11. The offset detection circuit according to claim 9, wherein the clock signal has a frequency that is at least twice a bandwidth of the audio signal.

12. The offset detection circuit according to claim 9, wherein the clock signal to the up/down counter is stopped when the count value reaches the overflow occurs and is resumed when the detection signal indicates that the audio signal is less than the fixed voltage.

13. The offset detection circuit according to claim 9, wherein the overflow occurs when the count value exceeds an overflow set value and the underflow occurs when the count value is less than an underflow set value.

14. The offset detection circuit according to claim 13, wherein the overflow threshold and the underflow threshold are adjustable values.

15. The offset detection circuit according to claim 9, further comprising a clock thinning-out unit that reduces the number of clock pulses received by the up/down counter during a thinning out period.

16. The offset detection circuit according to claim 15, wherein the thinning out period occurs while output detection signal indicates that the audio signal has exceeded the fixed voltage.

17. The offset detection circuit according to claim 15, wherein the thinning-out unit uses a reduction signal to perform the thinning-out of the clock, the reduction signal having a frequency that is lower than a frequency of the clock pulses.

18. The offset detection circuit according to claim 9, further comprising another determination unit that includes:
an up/down counter in which a count value increments in response to the clock signal while the detection signal indicates that the audio signal has exceeded another fixed voltage, and in which the count value decrements in response to the clock signal while the detection signal indicates that the audio signal has not exceeded the other fixed voltage; and an overflow detection unit and an underflow detection unit that detects when the count value reaches an overflow or an underflow respectively, the overflow indicating that an offset is present in the audio signal, and the underflow indicating that the offset is not present in the audio signal.

19. An offset detection circuit, comprising:

a first offset detection comparator configured to compare an audio signal to a first fixed voltage to provide at an output thereof a first detection signal that indicates whether or not the audio signal has exceeded the first fixed voltage; and a second offset detection comparator configured to compare the audio signal to a second fixed voltage to provide at an output thereof a second detection signal that indicates whether or not the audio signal has exceeded the second fixed voltage; and a determination unit including a first low pass filter, a first comparator, a second low pass filter, and a second comparator, wherein the first low pass filter integrates the output of the first offset detection comparator, wherein the first comparator indicates at an output thereof whether or not an output of the first low pass filter exceeds a predetermined value, wherein the second low pass filter integrates the output of the second offset detection comparator, wherein the second comparator indicates at an output thereof whether or not an output of the second low pass filter exceeds the predetermined value, and wherein the determination unit outputs one of the outputs of the first comparator and the second comparator as a determination result that indicates whether an offset is present.

20. The offset detection circuit according to claim 19, wherein the first and second low pass filters are R/C circuits.

* * * * *